(12) United States Patent
Jacobs et al.

(10) Patent No.: US 12,272,845 B2
(45) Date of Patent: Apr. 8, 2025

(54) METHOD OF COATING ONE OR MORE METAL COMPONENTS OF A FUEL CELL STACK, COMPONENT OF A FUEL CELL STACK AND APPARATUS FOR COATING ONE OR MORE COMPONENTS OF A FUEL CELL STACK

(71) Applicant: IHI HAUZER TECHNO COATING B.V., Venlo (NL)

(72) Inventors: Ruud Jacobs, Venlo (NL); Kenji Fuchigami, Düsseldorf (DE); Roel Bosch, Geldrop (NL); Dave Doerwald, Nijmegen (NL); Philipp Immich, Issum (DE)

(73) Assignee: IHI HAUZER TECHNO COATING B.V., Venlo (NL)

( * ) Notice: Subject to any disclaimer, the term of this patent is extended or adjusted under 35 U.S.C. 154(b) by 661 days.

(21) Appl. No.: 17/628,783

(22) PCT Filed: Aug. 10, 2020

(86) PCT No.: PCT/EP2020/072423
§ 371 (c)(1),
(2) Date: Jan. 20, 2022

(87) PCT Pub. No.: WO2021/028399
PCT Pub. Date: Feb. 18, 2021

(65) Prior Publication Data
US 2022/0384820 A1    Dec. 1, 2022

(30) Foreign Application Priority Data

Aug. 14, 2019 (EP) ..................................... 19191663
Oct. 7, 2019 (EP) ..................................... 19201781

(51) Int. Cl.
*H01M 8/0228* (2016.01)
*C23C 14/02* (2006.01)
(Continued)

(52) U.S. Cl.
CPC ......... *H01M 8/0228* (2013.01); *C23C 14/021* (2013.01); *C23C 14/025* (2013.01);
(Continued)

(58) Field of Classification Search
CPC ............. H01M 8/0228; H01M 4/8657; H01M 4/8663; H01M 4/8892; H01M 4/9041;
(Continued)

(56) References Cited

U.S. PATENT DOCUMENTS 8,906,571 B2   12/2014  Sato et al.
10,941,483 B2   3/2021  Yamamoto et al.
(Continued)

FOREIGN PATENT DOCUMENTS

CN    1727410 A    2/2006
CN    101444985 A   6/2009
(Continued)

OTHER PUBLICATIONS

Ito et al. Thermal stability of UBM sputtered DLC coatings with various hydrogen contents. Thin Solid Films, vol. 517, 2008, pp. 1115-1119. Retrieved from <URL: https://www.sciencedirect.com/science/article/pii/S0040609008010067> (Year: 2008).*

(Continued)

*Primary Examiner* — James M Erwin
(74) *Attorney, Agent, or Firm* — Harness, Dickey & Pierce, P.L.C.

(57) ABSTRACT

The present invention relates to a method of coating one or more metal components of a fuel cell stack, such as a bipolar plate, an electrode, gaskets etc., the method comprising the steps of providing an uncoated metal component; etching
(Continued)

Figure 1:
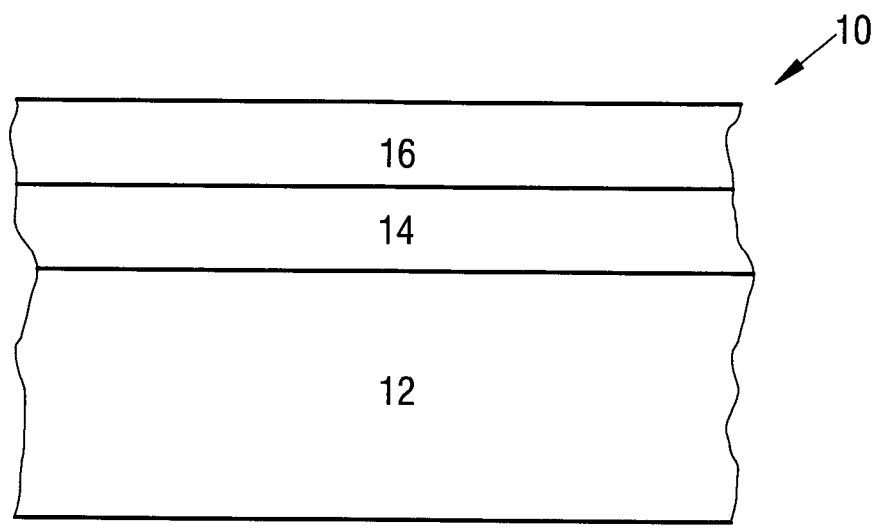

said uncoated metal component; optionally depositing an adhesion layer on the etched uncoated metal component; and depositing a carbon coating on either the adhesion layer or on the etched uncoated metal component, with the adhesion layer and the carbon coating respectively being deposited by means of one of a physical vapor deposition process, an arc ion plating process, a sputtering process, and a Hipims process. The invention further relates to a component of a fuel cell stack and to an apparatus for coating one or more components of a fuel cell stack.

30 Claims, 8 Drawing Sheets

(51) Int. Cl.
| | | |
|---|---|---|
| *C23C 14/06* | (2006.01) | |
| *C23C 14/32* | (2006.01) | |
| *H01M 4/86* | (2006.01) | |
| *H01M 4/88* | (2006.01) | |
| *H01M 4/90* | (2006.01) | |
| *H01M 8/0206* | (2016.01) | |
| *H01M 8/0213* | (2016.01) | |
| *H01M 8/0282* | (2016.01) | |
| *H01M 8/0286* | (2016.01) | |

(52) U.S. Cl.
CPC ........ *C23C 14/0605* (2013.01); *C23C 14/325* (2013.01); *H01M 4/8657* (2013.01); *H01M 4/8663* (2013.01); *H01M 4/8892* (2013.01); *H01M 4/9041* (2013.01); *H01M 8/0206* (2013.01); *H01M 8/0213* (2013.01); *H01M 8/0282* (2013.01); *H01M 8/0286* (2013.01)

(58) Field of Classification Search
CPC ............. H01M 8/0206; H01M 8/0213; H01M 8/0282; H01M 8/0286; C23C 14/021; C23C 14/025; C23C 14/0605; C23C 14/325
USPC ........................................................ 429/509
See application file for complete search history.

(56) References Cited

U.S. PATENT DOCUMENTS

| | | | |
|---|---|---|---|
| 2010/0035120 A1 | 2/2010 | Sato et al. | |
| 2010/0129615 A1 | 5/2010 | Chizik et al. | |
| 2011/0229800 A1 | 9/2011 | Jeon et al. | |
| 2011/0287336 A1* | 11/2011 | Himeno ............... | H01M 8/0228 429/492 |
| 2011/0305912 A1 | 12/2011 | Teer et al. | |
| 2014/0227631 A1 | 8/2014 | Jun et al. | |
| 2015/0037710 A1 | 2/2015 | Cooke et al. | |
| 2016/0240865 A1 | 8/2016 | Hirano et al. | |

FOREIGN PATENT DOCUMENTS

| | | |
|---|---|---|
| CN | 102306804 A | 1/2012 |
| CN | 102723499 A | 10/2012 |
| CN | 102800871 A | 11/2012 |
| CN | 105895927 A | 8/2016 |
| DE | 102005033769 A1 | 1/2007 |
| DE | 112006001829 T5 | 5/2008 |
| DE | 102013220383 A1 | 10/2014 |
| DE | 102014113736 A1 | 11/2015 |
| DE | 102017202679 A1 | 8/2018 |
| DE | 102017128730 A1 | 6/2019 |
| EP | 0511153 A1 | 10/1992 |
| EP | 2369668 B1 | 9/2011 |
| EP | 2628817 A1 | 8/2013 |
| JP | 200593172 A | 4/2005 |
| JP | 2008204876 A | 9/2008 |
| JP | 2009545670 A | 12/2009 |
| JP | 2010272490 A | 12/2010 |
| JP | 201152266 A | 3/2011 |
| JP | 2012043775 A | 3/2012 |
| JP | 2014098184 A | 5/2014 |
| JP | 2016030845 A | 3/2016 |
| JP | 2018006300 A * | 1/2018 |
| JP | 2018 52784 A | 4/2018 |
| WO | WO-2008015016 A1 | 2/2008 |
| WO | WO-2013/124690 A1 | 8/2013 |
| WO | WO-2018150046 A1 | 8/2018 |

OTHER PUBLICATIONS

European Office Action regarding Application No. 19201781.2, dated Mar. 4, 2020.
International Search Report and Written Opinion regarding International Application No. PCT/EP2020/072423, dated Feb. 18, 2021.
Götz, Michael. "STAble and low cost Manufactured bipolar plates for PEM Fuel Cells." Stampen (2015): 1-22.
"ZV1200_A Modular Sputtering System." Leybold-Heraeus 12-170. 1/2 (Printed Apr. 2, 2022): 1-12. https://www.chiphistory.org/zv1200-in-line-sputtering-system-1980.
"PEM BPP Technoport 2012." Stampen International workshop Bipolar Plates for PEM technology (May 2015):1.
Hamilton, Phil. "Developments in PVD Coatings for PEMFC Bipolar Plates." Teer Coatings Limited, International Workshop, Sattledt, Austria (May 2015):1-22.
Yi et al. "Carbon-based coatings for metallic bipolar plates used in proton exchange membrane fuel cells" International Journal of Hydrogen Energy, vol. 44, 2019, pp. 6814-6843.
Pasaja et al. "Mo-containing tetrahedral amorphous carbon deposited by dual filtered cathodic vacuum arc with selective pulsed bias voltage" Nuclear Instruments and Methods in Physics Research B, 259, 2007, pp. 867-870.
Bi et al. "Mechanisms of growth, properties and degradation of amorphous carbon films by closed field unbalanced magnetron sputtering on stainless steel bipolar plates for PEMFCs" Applied Surface Science, 422, 2017, pp. 921-931.
Pancielejko et al. "Optimization of the deposition parameters of DLC coatings with the MCVA method" Archives of Materials Science and Engineering, vol. 54, 2012, pp. 60-67.
Vetter "60 years of DLC coatings: Historical highlights and technical review of cathodic arc processes to synthesize various DLC types, and their evolution for industrial applications" Surface & Coatings Technology, 257, 2014, pp. 213-240.
Marques et al. "Argon Implantation in Tetrahedral Amorphous Carbon Deposited by Filtered Cathodic Vacuum Arc" Journal of Materials Engineering and Performance, vol. 22(5), 2013, pp. 1396-1404.
Lux et al. "The Role of Substrate Temperature and Magnetic Filtering for DLC by Cathodic Arc Evaporation" Coatings, 2019, 9, 345, pp. 1-15.
Chinese Office Action regarding Application No. 202080053823.4, dated Jan. 26, 2024.
Japanese Office Action regarding Application No. 2022508955, dated Mar. 26, 2024.
European Notice of Opposition regarding Application No. 19201781.2, dated Apr. 9, 2024.

* cited by examiner active side | back side

Ti-C HDR 1,4V 1h | Ti+C HDR CV | Ti+C 1,4V 1h

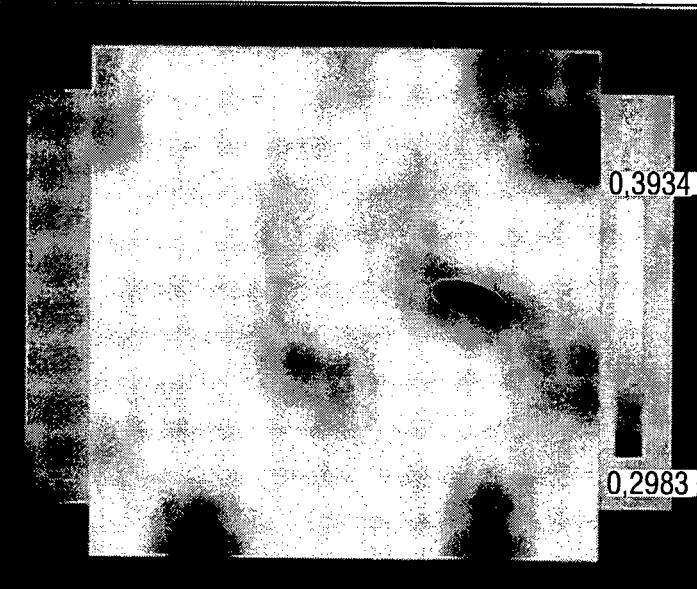
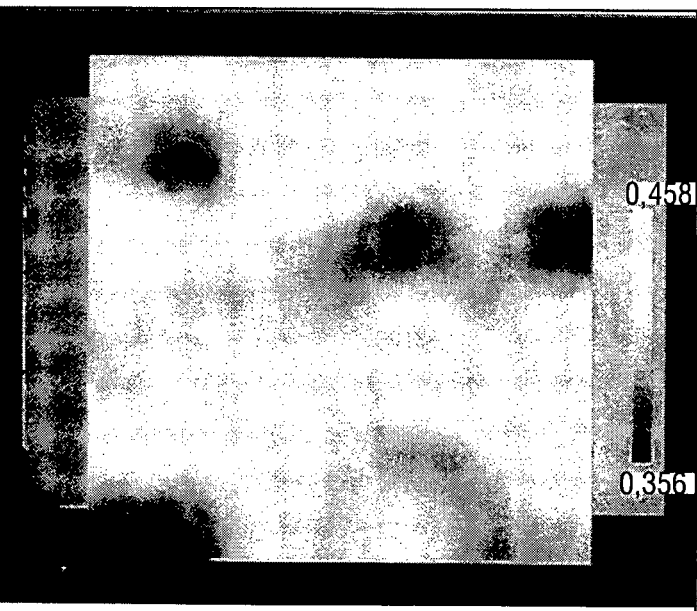
Fig.10

METHOD OF COATING ONE OR MORE METAL COMPONENTS OF A FUEL CELL STACK, COMPONENT OF A FUEL CELL STACK AND APPARATUS FOR COATING ONE OR MORE COMPONENTS OF A FUEL CELL STACK

CROSS-REFERENCE TO RELATED APPLICATIONS

This application is a U.S. National Phase Application under 35 U.S.C. 371 of International Application No. PCT/EP2020/072423, filed on Aug. 10, 2020, which claims the benefit of European Patent Application No. 19191663.4, filed on Aug. 14, 2019, and European Patent Application No. 19201781.2, filed on Oct. 7, 2019. The entire disclosures of the above applications are incorporated herein by reference.

The present invention relates to a method of coating one or more metal components of a fuel cell stack, such as a bipolar plate, an electrode, gaskets etc., the method comprising the steps of providing an uncoated metal component; etching said uncoated metal component; optionally depositing an adhesion layer on the etched uncoated metal component; and depositing a carbon coating on the adhesion layer, with the adhesion layer and the carbon coating respectively being deposited by means of one of a physical vapor deposition process, an arc ion plating process, a sputtering process, and a Hipims process. The invention further relates to a component of a fuel cell stack and to an apparatus for coating one or more components of a fuel cell stack.

The automotive industry is seeking for low cost, high volume solutions for developing and manufacturing fuel cell vehicles. One of the main components in a fuel cell stack are the bipolar plates (BPP). Low cost steel can be mechanically formed relatively easily into so-called half plates with good quality flow fields (note two welded half plates make a bipolar plate). However, a conductive and protective coating on the steel is required to provide a fuel cell lifetime of at least 5000 hours due to the aggressive operating environment under low PH value and voltage level.

Further prior art methods and apparatus of coating metal substrates are respectively known from DE 10 2017 202679 A1; US 2014/227631 A1; DE 20 2014 113736 A1; EP 2 628 817 A1; and DE 10 2005 003769 A1.

For this reason it is an object of the present invention to provide a method of fabricating components of a fuel cell stack, that can be carried out in a short time period to produce large volumes of fuel cells that are resistant to the chemical environment the fuel cells will be subjected to and that have a lifetimes of more than 5000 hours in operating conditions.

This object is satisfied by a method according to claim 1.

Such a method of coating one or more metal components of a fuel cell stack, such as a bipolar plate, an electrode, gaskets etc., comprises the steps of:
providing an uncoated metal component;
etching said uncoated metal component;
optionally depositing an adhesion layer on the etched uncoated metal component by means of one of a physical vapor deposition process (PVD process), an arc physical vapor deposition process (arc-PVD process), an arc ion plating process, a sputtering process, and a Hipims process; and
depositing a carbon coating on the adhesion layer if provided or on the etched uncoated metal component by means of one of an arc physical vapor deposition process, an arc ion plating process, and a Hipims process.

The prior art mentioned in the foregoing does not teach a method, an article or an apparatus with a carbon coating having an at least substantially hydrogen free DLC layer, that can be deposited by one of an arc physical vapor deposition process, an arc ion plated process, and a Hipims process.

By means of such a process, components of a fuel cell stack can be coated in a comparatively short period of time permitting the production of large volumes of fuel cells. Moreover, the fuel cells may be more resistant to the chemical environment the fuel cells are used if the adhesion layer is provided.

In this connection it should be noted that the component may be a bipolar plate, optionally coated on 1 or 2 sides, a half plate, also optionally coated on 1 or 2 sides. Generally speaking the metal component will be a component comprising stainless steel as a material because of the low cost of stainless steels. Other materials may be a metal component comprising Ti, this then may only require a single carbon coating without an adhesion layer making the manufacture of such components simpler, but the component more expensive due to the cost of Ti. Further materials of the component that may be used are Aluminum because of the low cost and low weight of Aluminum products.

The adhesion layer may provide improved adhesion of the carbon layer at the substrate, may decrease the diffusion of ions out of the component into the fuel cell membrane which diffusion could lead to a poisoning of the electrolyte and a reduced performance of the fuel cell.

In this connection it should be noted that the use of Ti in the adhesion layer is generally preferred to the use of Cr, since the transpassivation potential of Ti is much higher than of Cr (2 eV vs. 1.2 eV), meaning that a Ti adhesion layer will oxidize at much higher voltages than Cr. Cr oxidation is not stable, and can lead to coating instability towards the bipolar plate substrate. Ti-oxide in contrast is very stable and leads to surface passivation at locations where there is no carbon (at pinholes).

In this connection it should be noted that the carbon coating can be referred to as a DLC (diamond-like carbon) layer, a h-free DLC layer, an a-C layer, and a ta-C layer. The preferred choice of layer is a hydrogen free DLC layer in which the Hydrogen content is almost zero.

In this connection a density of the hydrogen free DLC layer is generally selected in the range 2.1 to 2.3±0.1 g/cm3.

A preferred Argon content of the hydrogen free DLC layer is less than 1 at % Argon, preferably between 0.05 and 0.5 at % Argon at % based on 100 at % of the at least substantially hydrogen free DLC layer.

In comparison to this a sputtered carbon coating has an argon content of 2.2 at % argon based on 100 at % of the at least substantially hydrogen free DLC layer, such that forming an arc-PVD coating leads to a significant reduction in the Argon content of the hydrogen free DLC layer.

Using such a process fuel cell stacks can be formed that have lifetimes of more than 5000 hours in operating conditions, i.e. in which a voltage is built up at the fuel cell stacks while these are present in an electrolyte.

Moreover, comparatively low-cost components can be created by way of such coating processes.

The use of carbon coatings on the one hand ensures the electrical properties of e.g. an active side of a bipolar plate, and also provides a mechanical stable and durable coating on the component of the fuel cell stack. In this connection it should be noted that the purpose of the carbon coating is to provide corrosion reduction and electrical conductivity in the range of 0.1 to 2 m$\Omega \cdot ^2$ for flat test plates. For bipolar plates respectively half plates that have flow channels the electrical conductivity lies in the range of 0.1 to 2 m$\Omega \cdot ^2$.

A common method to deposit carbon is by sputtering or unbalanced magnetron (UBM) sputtering. It is a well-known method for inline coating as sputtering provides good uniformity, controllability and long target life time which is mostly required for industrial production (for example glass coating machines, PVD lines for display glass coating, and roll-to-roll coating machines).

Furthermore, UBM provides clean and smooth coatings without any droplets from the target material. Arc PVD or arc ion plating on the other hand, is a very fast deposition technology but more difficult to implement for robust industrial processing due to the fact that the arc PVD as used in this case is a point process rather than a line process.

Machine complexity and design efforts are also higher in order to deliver a reliable, controllable and uniform industrial process. However, the final solution provides much higher productivity and hence lower cost of ownership for the user compared to the implementation of more conventional UBM technology.

Also, arc PVD or arc ion plating process generates more droplets than UBM. However, for this application that requires the application of a relatively thin coating, the number of droplets is reduced significantly. Furthermore, test results obtained with the arc PVD carbon coating have not revealed any drawbacks or negative effects from the presence of droplets on the carbon surface.

The step of etching may be a plasma etching process carried out for a period ranging between 1 and 60 minutes with a bias voltage of between −0 to −350 V.

Alternatively the step of etching may comprise an metal ion etching process carried out for a period ranging between 1 and 60 minutes with a bias voltage of between 0 to −1200 V. The etching process may be an argon plasma etching process having a bias voltage selected in the range of 0 to −350V. Alternatively, the etching process may be a metal ion etching process having a bias voltage selected in the range of −800V to −1200V.

The etching process is used in order to remove an oxide layer present on the substrate. The oxide layer leads to less electrical conductivity and less adhesion of the coating hence its removal is desired to increase the electrical conductivity of the one or more metal components of a fuel cell stack and also the adhesion of the coating to the one or more metal components of a fuel cell stack.

The step of depositing an adhesion layer may comprise depositing a layer having a thickness in the range of 25 to 500 nm, preferably of 75 to 300 nm, at a bias voltage selected in the range of −0 to −350V.

Such an adhesion layer may provide a further improved adhesion of the carbon layer at the substrate, may influence the diffusion of ions between the individual layers of the coated component, and may provide additional corrosion protection of the coated component.

The adhesion layer may comprise at least one layer of Ti, Cr, Ta, Nb, Zr, TiN, CrN, NbN, ZrN, TaN and combinations thereof, in particular wherein the adhesion layer comprises Ti. Such materials have been found to provide a particularly beneficial type of adhesion layer.

The adhesion layer may comprise a layer of one or more materials comprising the adhesion layer and one or more gradient layers comprising:

a first gradient layer of metal mixed with said one or more materials of the adhesion layer with the amount of metal decreasing over a height of the first gradient layer and an amount of the one or more materials of the adhesion layer increasing over the height of the first gradient layer, up to the layer comprising said one or more one or more materials of the adhesion layer; and/or a second gradient layer comprising the one or more materials of the adhesion layer mixed with the carbon of the carbon coating, with the amount of the one or more materials of the adhesion layer decreasing over a height of the second gradient layer and an amount of carbon increasing over the height of the second gradient layer up to the carbon coating.

The carbon coating may be deposited with a layer thickness selected in the range of 5 to 500 nm at a bias voltage of −20 to −200V. Such carbon coatings have been found to be mechanically stable and also resistant to the chemical environments present in the fuel cell stack.

The carbon coating may comprise an at least substantially hydrogen free DLC layer, deposited by one of an arc-PVD process arc ion plated process, and a Hipims process. Such processes enable a deposition of particularly favorable and high quality carbon coatings on the adhesion layer. Particularly on use of arc-PVD particularly stable coatings on the metal component have been produced which are mechanically, chemically and electrically stable in the operating environment present in a fuel cell.

The at least substantially hydrogen DLC layer may comprise either a top layer having a dopant present therein, or may include a dopant throughout the at least substantially hydrogen free DLC layer, optionally:

wherein the dopant may be selected from the group of members consisting of titanium, zirconium, hafnium, vanadium, niobium, tantalum, chromium, molybdenum, tungsten, nitrogen, silicon and combinations of the foregoing; and/or wherein a percentage of the dopant may be 0.2 to 10 at %, in particular 0.5 to 6 at %, based on 100 at % of the at least substantially hydrogen free DLC layer respectively of the top layer comprising the dopant. The use of dopants in a DLC layer or on top of the DLC layer can influence the internal stresses in the coated components or in the DLC layer leading to improved adhesion between the different layers and hence to improved lifetimes of such components.

Said method may be conducted in a vacuum chamber and a temperature of said vacuum chamber may be regulated to a temperature in the range of 120 to 400° C., in particular of 160 to 250° C. during said step of coating said component with the carbon coating. In this way particularly hard and durable layer structures can be formed.

A pressure in said vacuum chamber may be regulated to a pressure of $10^{-2}$ to $10^{-4}$ mbar during said step of coating said bipolar plate or half plate with an at least substantially hydrogen free DLC layer. Such pressures are suited to form the desired structures in an efficient manner.

According to a further aspect the present invention relates to a component of a fuel cell stack, such as a bipolar plate, a half plate, an electrode and a gasket, optionally formed using a method in accordance with at least one of the preceding claims, the fuel cell component comprising:

a metal component, an adhesion layer optionally formed on said metal component, and a carbon coating formed on said adhesion layer if provided or directly on said metal component, said carbon coating comprising an at least substantially hydrogen free DLC layer optionally having a hardness selected in the range of 20 to 70 GPa and/or an Argon content of less than 1 at % Argon based on 100 at % of the at least substantially hydrogen free DLC layer.

Such a component can be reliably used in a fuel cell for more than 5000 hours of operating conditions. Moreover, the advantages discussed in the foregoing which can be achieved forming a component using a method as described herein also apply to the component discussed herein.

The component of the fuel cell stack further comprises an adhesion layer that is arranged between the metal component and the at least substantially hydrogen free DLC layer, with the adhesion layer optionally comprising at least one material selected from the group of members consisting of titanium, zirconium, hafnium, vanadium, niobium, tantalum, chromium, molybdenum, tungsten, nitrogen, silicon, carbon, and combinations of the foregoing and preferably comprising titanium, in particular wherein the adhesion layer has a layer thickness of 25 to 500 nm, preferably of 75 to 300 nm. The provision of an adhesion layer between the metal component and the DLC layer may provide an improved adhesion of the carbon layer at the substrate, may decrease the diffusion of ions out of the component into the fuel cell membrane. The diffusion can lead to a poisoning of the electrolyte and a reduced performance of the fuel cell. Moreover, the adhesion layer may provide additional corrosion protection of the coated component and hence improve the durability of the component of the fuel cell stack.

Moreover, at least substantially hydrogen free DLC layers have a comparatively high hardness which makes the surface these are present on more durable to scratches. It has also been found that a hydrogen free DLC layer is less susceptible to chemical environments such as the ones present in a fuel cell increasing the lifetime of products that are coated with such layer structures.

Furthermore, at least substantially hydrogen free DLC layers have a comparatively good coating adhesion and a high hardness and hence also for this reason lead to an increased lifetime of the component of the fuel cell stack.

In this connection it should be noted that an at least substantially hydrogen free DLC layer is a DLC layer containing less than 1 at % hydrogen based on 100 at % of the at least substantially hydrogen free DLC layer.

A proportion of the sp2 to sp3 content of the at least substantially hydrogen free DLC layer lies in the range of 80 to 30% sp2 to 20 to 70% sp3, in particular wherein the sp3 content is greater than 30% sp3 and especially above 40% based on 100% of the at least substantially hydrogen free DLC layer. In this connection the preferred range of ratios of sp2/sp3 lie in the range of 36% to 46% S sp2/sp3 of 36% to 46% sp2 and 64% to 54% sp3 for a carbon coating applied via arc-PVD. The at least substantially hydrogen free DLC layer may comprise one or more a ta-C layers and/or one or more a-C layers. These are beneficial characteristics of the at least substantially hydrogen free DLC layer.

In comparison to this a carbon coating which is sputtered comprises a range of ratios of sp2/sp3 in the range of 29% to 39% sp2 and 71% to 61% sp3.

In this connection it should be noted that the at least substantially hydrogen free DLC layer could either be formed by a single DLC layer having the characteristics listed in the foregoing, or comprise a plurality of DLC layers each varying slightly in their absolute values of the above characteristics in comparison to one another, e.g. with respect to their hardness. The provision of several DLC layers with e.g. varying hardness is beneficial from the point of view of reducing the internal stresses within the layer structures and hence leads to an improved adhesion of the DLC layer to the adhesion layer and thus an improved lifetime of the components coated in this way.

The metal component may comprise one or more metal layers selected from the group of members consisting of an aluminum layer, an aluminum alloy layer, a titanium layer, a titanium alloy layer, a stainless steel layer and combinations of the foregoing. Such metal layers are particularly suitable layer for e.g. bipolar plates of a fuel cell stack with particularly preferred materials of the bipolar plate comprising steel and stainless steel as these can be produced at the desired volume with reasonable demand in effort and cost.

The at least substantially hydrogen free DLC layer may have a hardness selected in the range of 30 to 50 GPa; and/or The at least substantially hydrogen free DLC layer may comprises one or more ta-C layers and/or one or more a-C layers; and/or A proportion of the sp2 to sp3 content of the at least substantially hydrogen free DLC layer may lie in the range of 30 to 80% sp2 to 70 to 20% sp3, in particular wherein the sp3 content may be greater than 30% sp3 and especially above 40% of the at least substantially hydrogen free DLC layer; and/or and/or wherein said at least substantially hydrogen free DLC layer may be a DLC layer containing less than 1 at % hydrogen based on 100 at % of the at least substantially hydrogen free DLC layer.

The at least substantially hydrogen free DLC layer may comprise either a top layer having a dopant present therein, or may include a dopant throughout the at least substantially hydrogen free DLC layer, optionally:

wherein the dopant may be selected from the group of members consisting of titanium, zirconium, hafnium, vanadium, niobium, tantalum, chromium, molybdenum, tungsten, nitrogen, silicon and combinations of the foregoing; and/or wherein a percentage of the dopant may be 0.2 to 10 at %, in particular 0.5 to 6 at %, based on 100 at % of the at least substantially hydrogen free DLC layer respectively of the top layer comprising the dopant.

The adhesion layer may comprise one or more gradient layers that are formed either directly beneath the at least substantially hydrogen free DLC layer, or directly on top of the metal component; in particular wherein the gradient layer comprises a mixture of the materials of at least some of the components of the layers formed either side of the gradient layer, in particular wherein a layer thickness of said one or more gradient layers is selected in the range of 2 to 200 nm.

The gradient layer may be formed directly on top of the adhesion layer and the material of the layer arranged directly beneath the gradient layer may be the material of the adhesion layer and the layer on top of the gradient layer may be the at least substantially hydrogen free DLC layer and/or the gradient layer is formed directly on top of the metal component and the material of the layer arranged directly beneath the gradient layer may be the material of the metal component and the material of the layer arranged directly on top of the gradient layer is the material of the adhesion layer.

Such gradient layers lead to an improvement of the bond strength between the respective layers, i.e. between the metal component and the adhesion layer and/or between the adhesion layer and the carbon coating. Such an improved bond strength increases the durability of the components and also makes these less susceptible to chemical attacks.

The carbon coating applied using the arc-PVD process may have a refractive index n in the range of 2.25 to 2.4 for an energy of 2 eV in ellipsometry measurements; and/or may have a refractive index n in the range of 1.6 to 1.8 for an energy of 4 eV in ellipsometry measurements. Such carbon coatings have an increased density in respect to carbon coatings applied using sputtering techniques.

Similarly the carbon coating applied using the arc-pVD process may have an absorption value k of 0.95 to 1.1 for an energy of 4 eV in ellipsometry measurements, thus yielding a carbon coating with improved electrical conductivity in comparison to carbon coatings applied using sputtering.

The carbon coating may have a surface roughness selected in the range of 0.9 to 1.5 nm (i.e. arithmetic mean height) for a scanning area of 1 $\mu m^2$, especially of 1 to 1.3 nm for a scanning area of 1 $\mu m^2$. The carbon coating may further have a surface area selected in the range of 2 to 4% Sdr for a scanning area of 1 $\mu m^2$, especially of 2.5 to 3.1% Sdr for a scanning area of 1 $\mu m^2$. Carbon coatings having such properties as those detailed above are more dense than comparable coatings applied using sputtering techniques. They also indicate that the carbon coating has a reduced surface roughness and surface area in comparison to sputtered carbon coatings, yielding carbon coatings which are less sensitive to chemical attacks in the environment of a fuel cell leading to more durable components of a fuel cell stack for carbon coatings applied using arc-PVD.

According to a further aspect the present invention relates to an apparatus for coating one or more components of a fuel cell stack, such as one or more bipolar plates, one or more half plates, one or more electrodes, one or more gaskets etc., said apparatus being configured to carry out a method as described herein, the apparatus the apparatus being an inline coating system, comprising:
- a plurality of vacuum chambers arranged in a series one after another
- one or more cathodes arranged in at least some of the plurality of vacuum chambers, the cathodes being a cathode for at least one of a physical vapor deposition process, an arc physical vapor deposition process, an arc ion plating process, a sputtering process, and a Hipims process; and
- one or more fixtures respectively configured to receive a plurality of the uncoated metal components, with the sides to be coated facing the one or more cathodes; wherein said one or more fixtures are arranged to be moved linearly within the respective vacuum chamber and from vacuum chamber to vacuum chamber, wherein each vacuum chamber is configured to carry out a process, with the processes being selected from the group of members comprising: heating, evacuating, etching, depositing one or more adhesion layers, coating, removing and/or combinations of the foregoing.

By means of such an apparatus the components of a fuel cell stack discussed in the foregoing can be coated with a durable coating.

Moreover, such coatings can be produced at high volumes in the inline PVD coating system at attractive costs per part Furthermore, if an arc-PVD process is used in the inline system, the speed of coating can be increased in comparison to sputtering thereby reducing equipment complexity and costs for the automotive industry, building industry, aviation industry, stationary applications, heavy duty transportation, marine applications, fork lift trucks etc.

Further benefits and advantageous embodiments of the invention will become apparent from the dependent claims, from the description and from the accompanying drawings.

Figure 2:
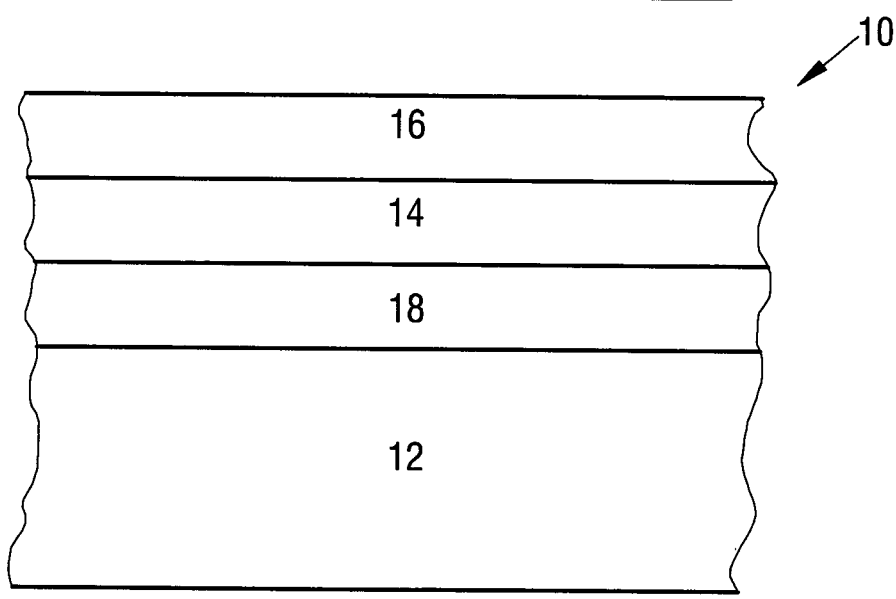
Figure 3:
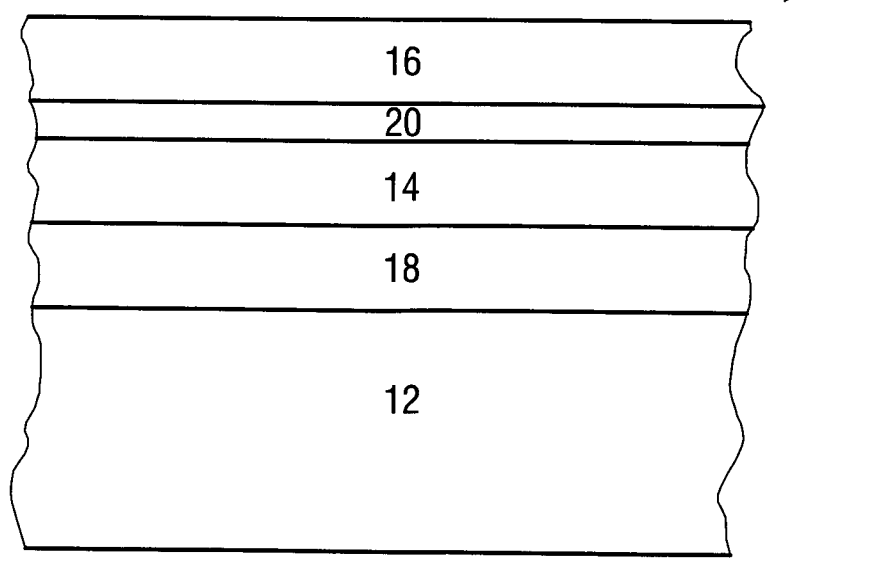
Figure 4:
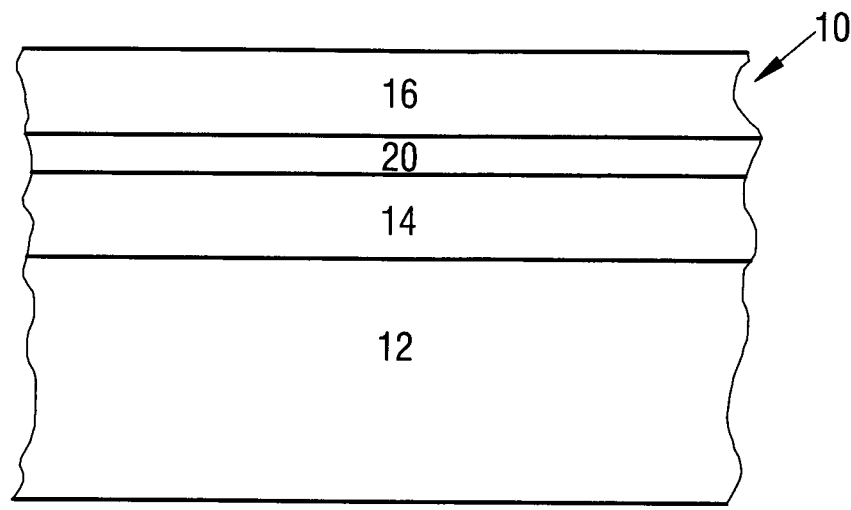
Figure 5:
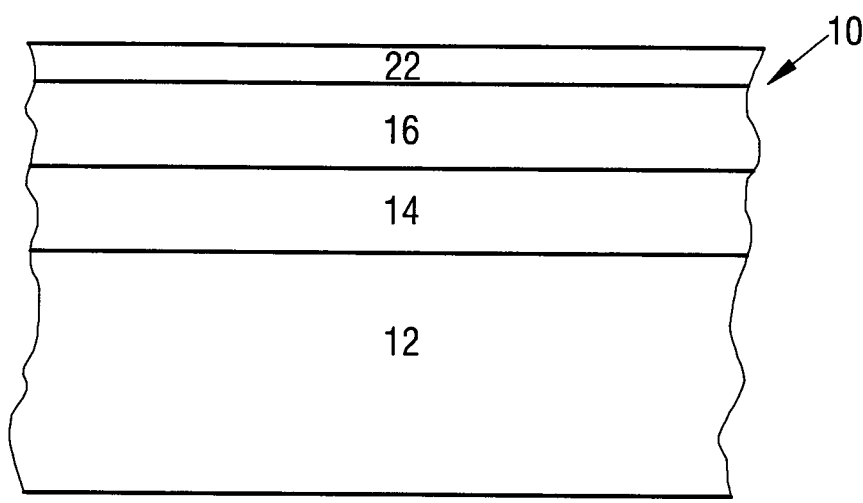
Figure 6:
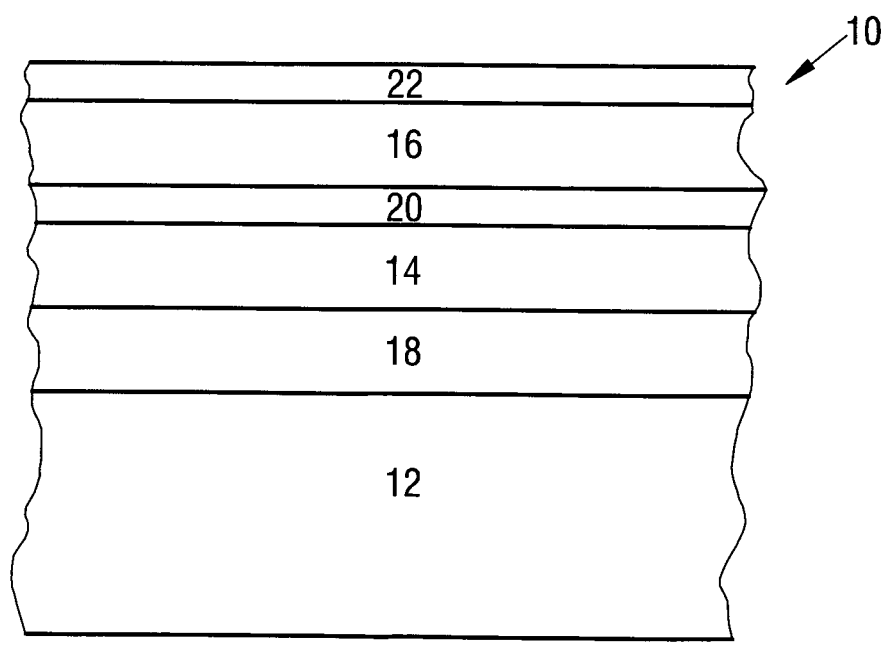
Figure 7:
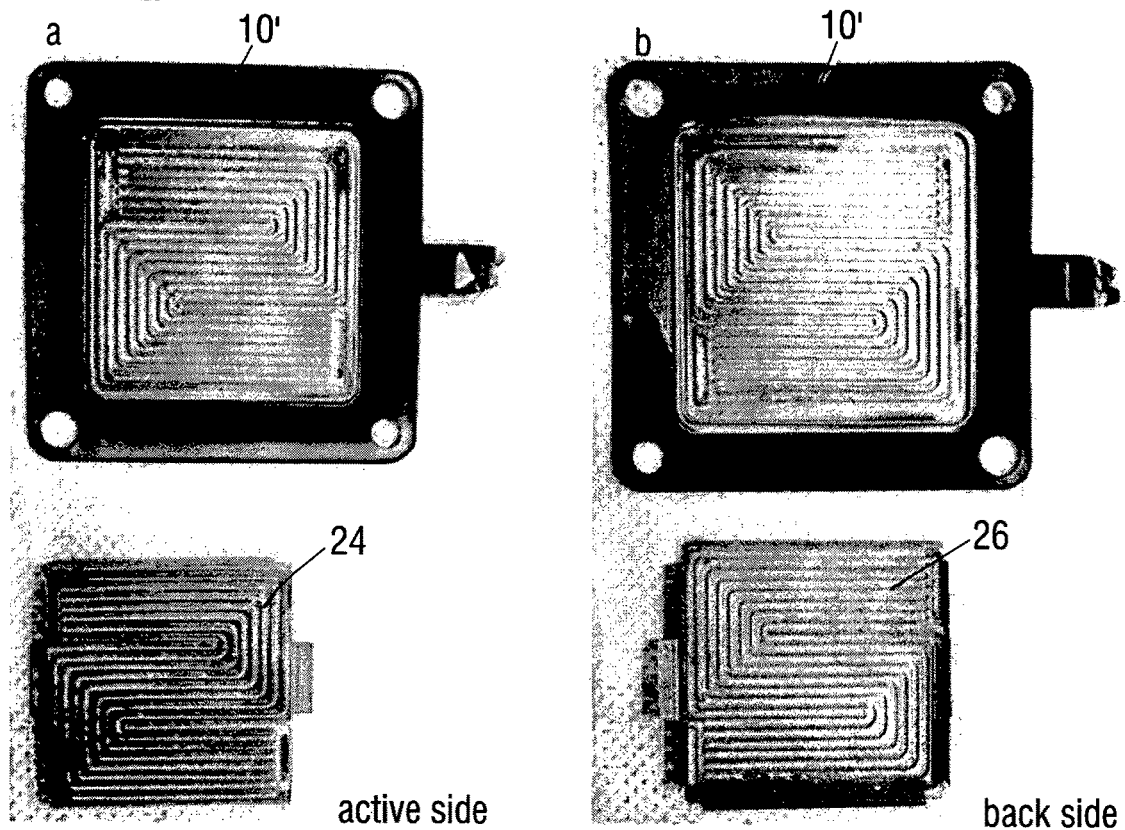
Figure 8:
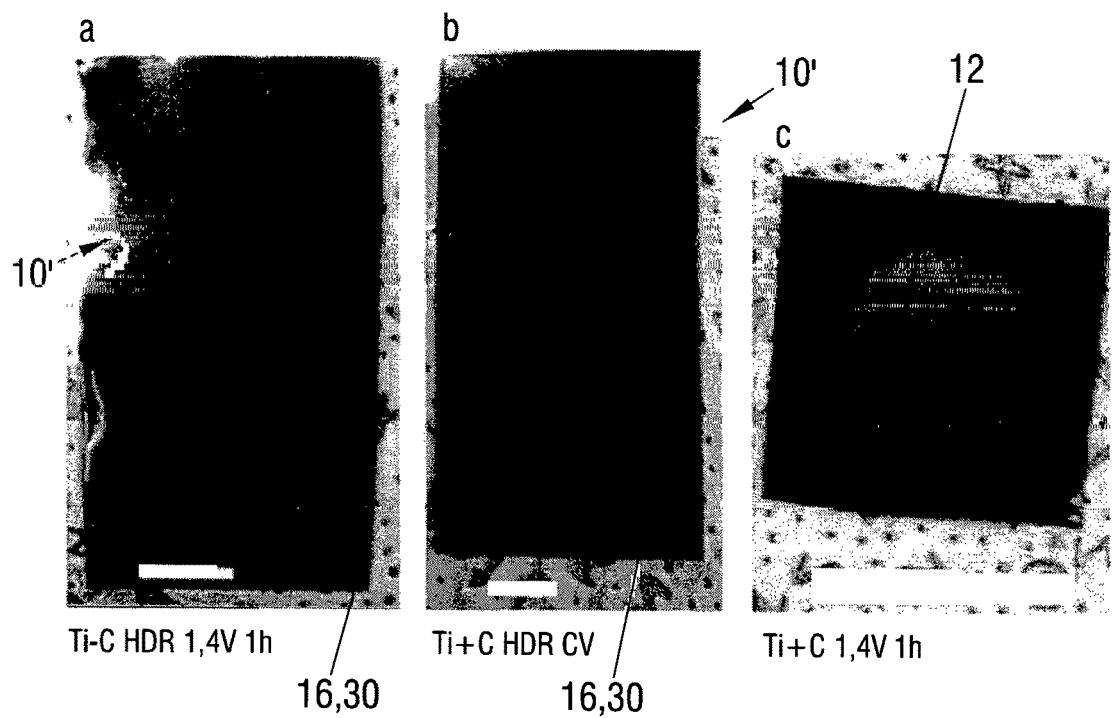
Figure 9:
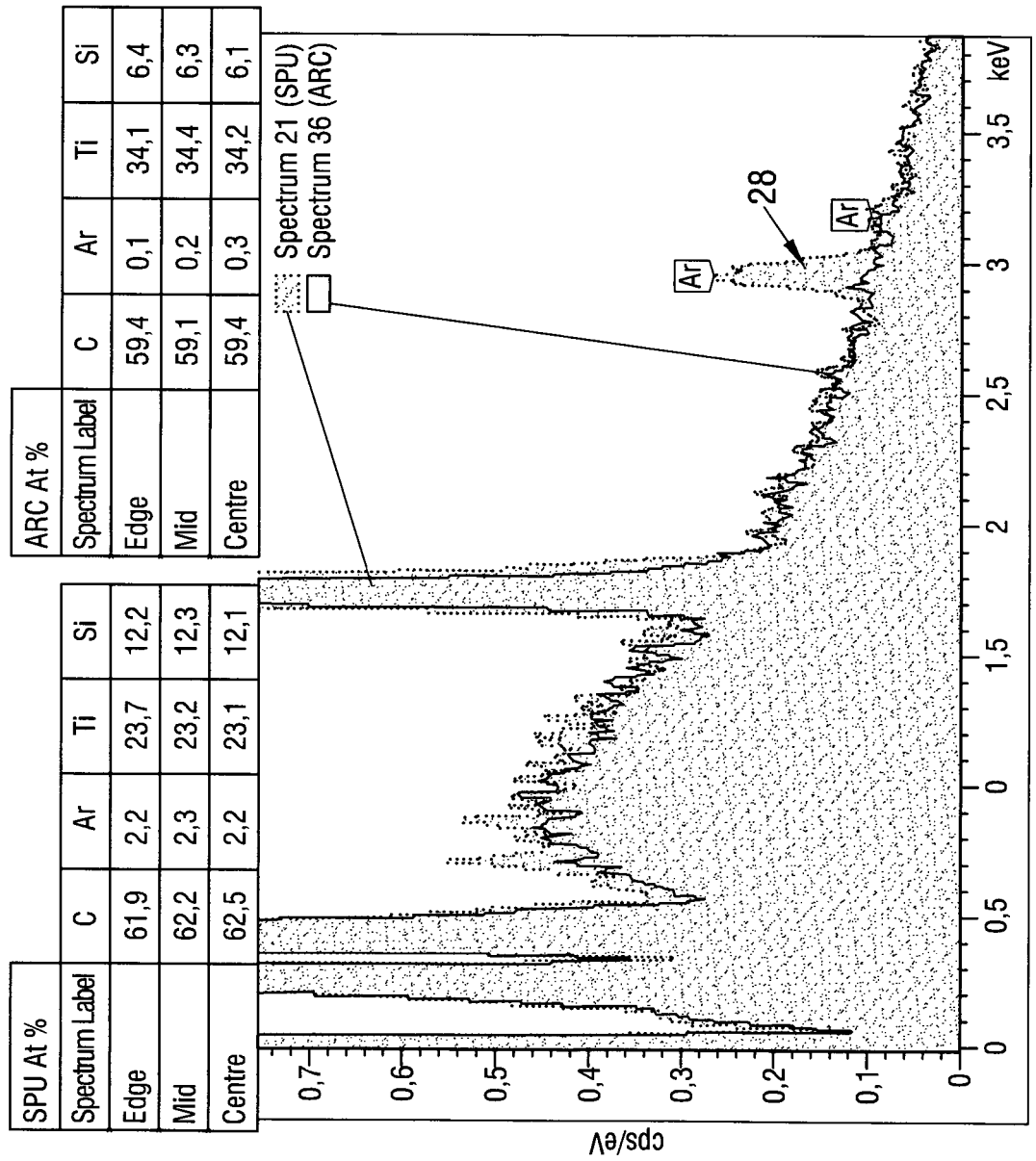
Figure 11:
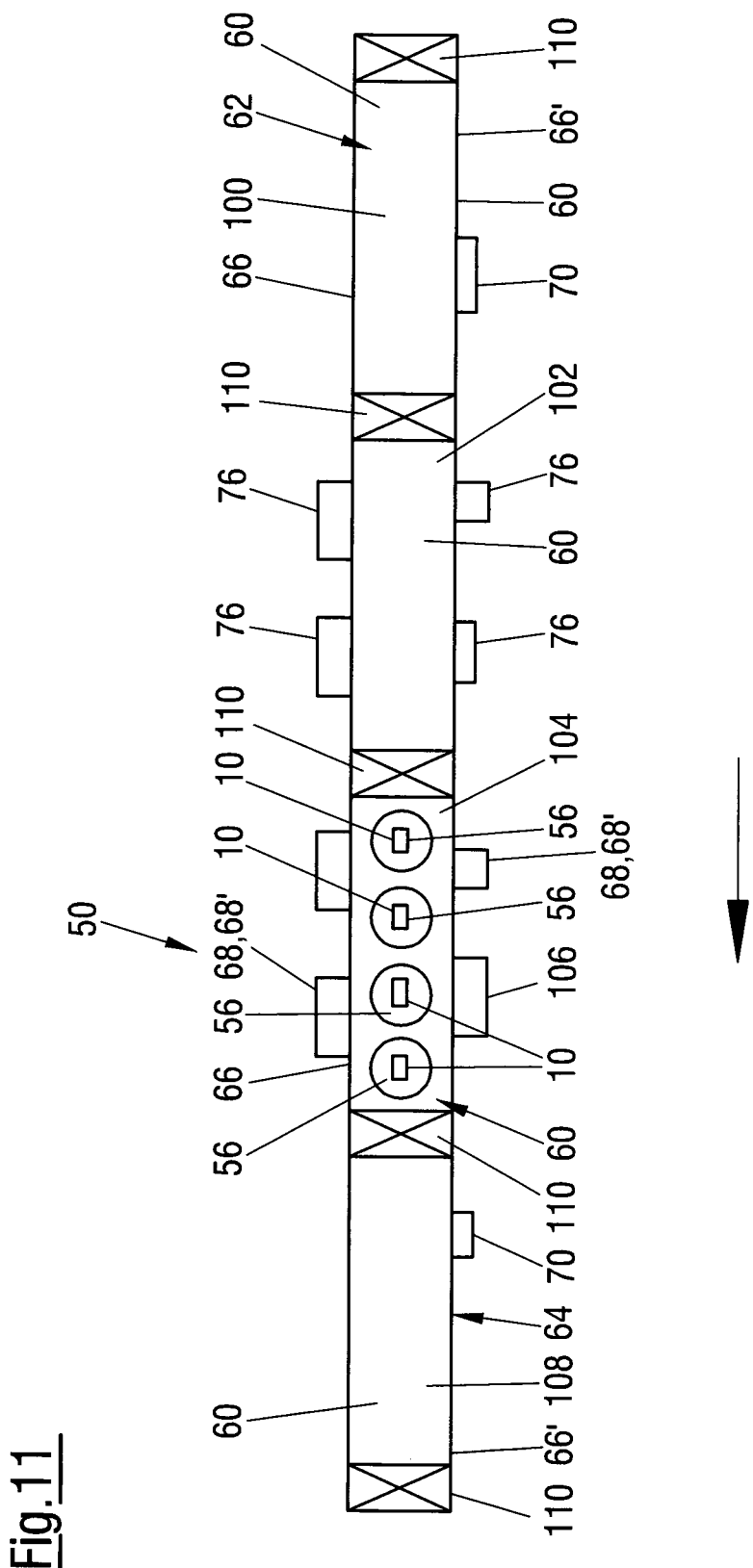
Figure 12:
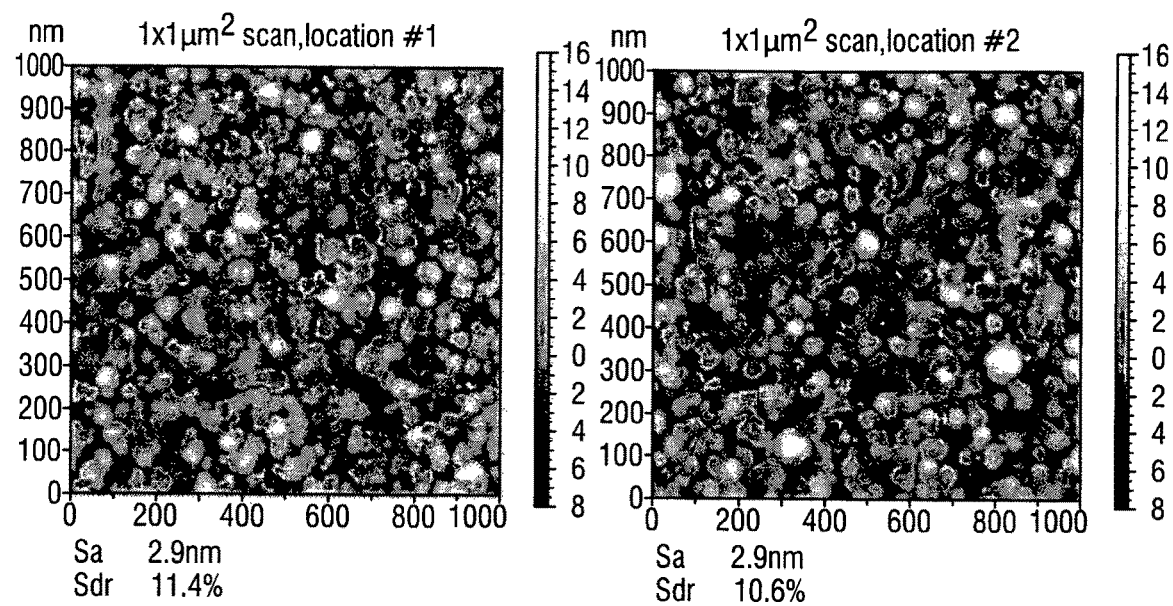
Figure 13:
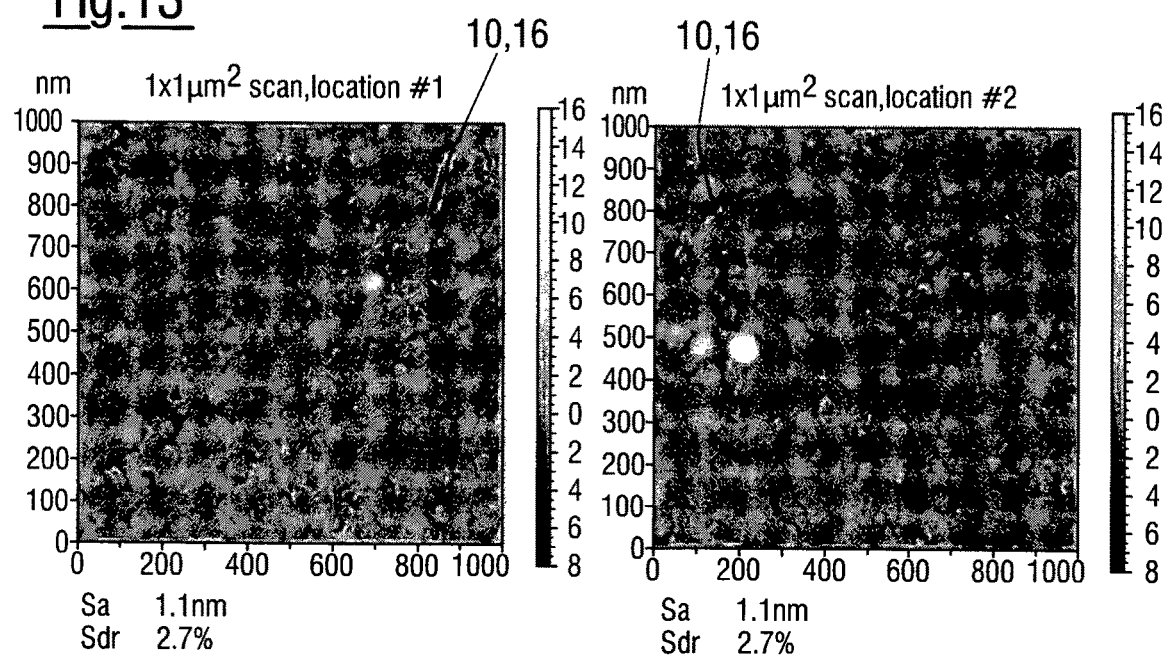

Further embodiments of the invention are described in the following description of the Figures. The invention will be explained in the following in detail by means of embodiments and with reference to the drawing in which is shown:

FIG. 1 a schematic sectional view of a metal component;
FIG. 2 a schematic sectional view of a further component;
FIG. 3 a schematic sectional view of a further component;
FIG. 4 a schematic sectional view of a further component;
FIG. 5 a schematic sectional view of a further component;
FIG. 6 a schematic sectional view of a further component;
FIG. 7a a photograph of a bipolar plate and of an active side thereof;
FIG. 7b a photograph of a bipolar plate and of a back side thereof;
FIG. 8a a photograph of a coated flat test plate and a carbon coating after a corrosion test conducted for one hour;
FIG. 8b a photograph of a coated flat test plate and a carbon coating after a corrosion test conducted for four hours;
FIG. 8c a photograph of a coated flat test plate and a carbon coating after a corrosion test conducted for one hour;
FIG. 9 EDX spectra of coated components, with one spectrum showing a component coated with arc-PVD and with the other component having been coated with a unbalanced magnetron sputtering process;
FIGS. 10a & b spectra showing sp2/sp3 ratios a) for a coated component coated using an unbalanced magnetron sputtering process and b) for a coated component coated using an arc-PVD process;
FIG. 11 a schematic view of an inline coating apparatus;
FIG. 12 AFM images of a surface of a coated component coated using a sputtered carbon process at two different scanning locations;
FIG. 13 AFM images of a surface of a coated component coated using an arc-PVD process at two different scanning locations; and
FIG. 14 results of ellipsometry measurements showing the refractive index n and absorption factor k versus energy/wavelength for samples coated with an arc-PVD process and samples coated using a sputtered carbon process.

In the following the same reference numerals will be used for parts having the same or equivalent function. Any statements made having regard to the direction of a component are made relative to the position shown in the drawing and can naturally vary in the actual position of application.

FIG. 1 shows a schematic sectional view of a component 10 of a fuel cell stack (not shown), such as a bipolar plate 10' (see FIGS. 7a and 7b). The component comprises a metal component 12 having an adhesion layer 14 deposited thereon. A carbon coating 16 is present on top of the adhesion layer 14.

On producing the component 10, the uncoated metal component 12 is subjected to an etching step, which may for example be a plasma etching process or an ion etching process. By way of example plasma etching processes are typically carried out for a period ranging between 1 and 60 minutes with a bias voltage of between −0 to −1200 V being applied at the uncoated metal component 12. The etching process may be an argon plasma etching process having a bias voltage selected in the range of 0 to −350V. Alternatively, the etching process may be a metal ion etching process having a bias voltage selected in the range of −800V to −1200V.

The adhesion layer 14 is deposited using a PVD process, for example an arc-PVD process during which a 25 to 500 nm thick adhesion layer 14 is deposited while a bias voltage selected in the range of −0 to −200V is applied at the metal component 12.

The adhesion layer 14 may comprise at least one of Ti, Cr, Ta, Nb, Zr, TiN, CrN, NbN, ZrN and combinations thereof, in particular wherein the adhesion layer 14 may comprise Ti or Cr. In this connection it should be noted that a preferred material of the adhesion layer is Ti.

The carbon coating 16 is deposited with a layer thickness selected in the range of 5 to 500 nm on top of the adhesion layer 14. During the deposition process a bias voltage of −20 to −200V is applied at the metal component 12. The carbon coating 16 preferably comprises one or more DLC layers 16.

The DLC layer 16 discussed herein is an at least substantially hydrogen free DLC layer 16 deposited by means of an arc-PVD process. Apart from the DLC coating applied in FIG. 8c which shows a PVD coating applied using unbalanced magnetron sputtering rather than arc-PVD.

An at least substantially hydrogen free DLC layer as discussed herein has at least one of the following characteristics:

- A hardness selected in the range of 20 to 70 GPa, in particular of 30 to 50 GPa. Such hardnesses are measured using nano-indentation of the surface using a Vickers diamond. In this connection it should be noted that the hardness measurement is performed according to DIN EN ISO 14577-1 (Standardized Nanoindentation).
- A proportion of the sp2 to sp3 content of the at least substantially hydrogen free DLC layer 18 lies in the range of 30 to 80% sp2 to 70 to 20% sp3, in particular wherein the sp3 content is greater than 30% sp3 and especially above 40% of the at least substantially hydrogen free DLC layer 18;
- The at least substantially hydrogen free DLC layer comprises one or more ta-C layers and/or one or more a-C layers, and/or
- The at least substantially hydrogen free DLC layer 18 comprises an argon content of less than 1 at % base on 100 at % of the hydrogen free DLC layer 18.

FIG. 2 shows a schematic sectional view of a further component 10. A gradient layer 18 is provided between metal component 12 and the adhesion layer 14. The gradient layer 18 is a mixed material layer comprising metal of the metal component 12 mixed with said one or more materials of the adhesion layer 14 with the amount of metal decreasing over a height of the gradient layer 18 towards the adhesion layer 14 and an amount of the one or more materials of the adhesion layer 14 increasing over the height of the gradient layer 18, up to the layer comprising said one or more one or more materials of the adhesion layer 14.

FIG. 3 shows a schematic sectional view of a further component 10. A second gradient layer 20 is provided in comparison to FIG. 2 namely between the adhesion layer 14 and the carbon coating 16. The second gradient layer 20 comprising one or more materials of the adhesion layer 14 mixed with the carbon of the carbon coating 16, with the amount of the one or more materials of the adhesion layer 14 decreasing over a height of the second gradient layer 20 and an amount of carbon increasing over the height of the second gradient layer 20 up to the carbon coating 16.

FIG. 4 shows a schematic sectional view of a further component 10. This component 12 only comprises one gradient layer which is arranged between the adhesion layer 14 and the carbon coating 16.

FIG. 5 shows a schematic sectional view of a further component 10. The difference to the component shown in FIG. 1 is that a top layer 22 is provided this top layer may be a coating to cover the carbon coating 16 or it is a mixed layer comprising a doped DLC layer 16.

FIG. 6 shows a schematic sectional view of a further component 10. This component 10 like the component shown in FIG. 3 comprises first and second gradient layers 18, 20 and a top layer 22.

In this connection it should be noted that the components 10 shown in FIGS. 2 and 4 may also be provided with such a top layer 22.

In this connection it should be noted that rather than having the top layer 22 with the dopant present therein, the at least substantially hydrogen free DLC layer 16 may include a dopant throughout the at least substantially hydrogen free DLC layer 16 and if provided the gradient layer 20 arranged between the adhesion layer 14 and the carbon coating 16 may also comprise a dopant.

The dopant may be selected from the group of members consisting of titanium, zirconium, hafnium, vanadium, niobium, tantalum, chromium, molybdenum, tungsten, nitrogen, silicon and combinations of the foregoing. The preferred dopants are titanium and zirconium.

A percentage of the dopant is 0.5 to 10 at %, in particular 1 to 4 at %, based on 100 at % of the at least substantially hydrogen free DLC layer respectively of the top layer comprising the dopant.

FIG. 7a shows a photograph of the bipolar plate 10' and of an active side 24 thereof. FIG. 7b shows a photograph of the bipolar plate 10' and of a back side 26 thereof. The bipolar plate comprises several channels extending over the active and back sides 24, 26. Typically the active side 24 and the back side is coated in the manner described herein, but it is also possible to coat only one of the sides 24, 26 in the manner described herein. The bipolar plate is of substantially square plate-like shape. In this connection it should be noted that also rectangular shaped bipolar plates can be used.

FIG. 8a shows a photograph of a coated flat test plate 10' having a carbon coating 16 after a corrosion test conducted for one hour. The carbon coating 16 has a black color and was provided using arc-PVD.

The corrosion test was conducted at a high voltage of 1.4 V applied at the test plate 10', the coating was still intact. In comparison to this carbon coatings sputtered onto the adhesion layer 14 or deposited using a standard PVD process show that the carbon coating is completely degraded after the same one hour corrosion test.

FIG. 8b shows a photograph of the coated test plate 10' and its carbon coating 16 after the corrosion test had been conducted for four hours. The coating is still intact. It is believed that the stability of the arc-PVD coated carbon coating 16 is due to the decreased argon content (see FIG. 9) and the sp2/sp3 ratio of such layers (see FIG. 10b in comparison with FIG. 10a). A further factor that may lead to the improved results is a possibly higher coating density. These differences are achievable using this arc-PVD process in comparison to standard PVD processes (UBM).

In contrast to FIGS. 8a and 8b which show a carbon coating applied via arc-PVD, FIG. 8c shows a photograph of a coated flat test plate and a carbon coating after a corrosion test conducted for one hour of a carbon coating applied using a sputtered PVD layer. The metal component 14 is clearly visible as a coin shaped item, hence the coating has completely been destroyed and is unusable. On examining the test plate further it was found that only the carbon coating was completely dissolved and that the adhesion coating was still present. The dissolving of the carbon layer is presumably due to oxidation effects.

FIG. 9 shows EDX spectra of coated components 10. The spectrum 36 shows the EDX spectrum for the coated component 10 coated with an arc PVD process. The spectrum 21 shows an EDX spectrum of coated components 10 coated with a standard PVD process using an unbalanced magnetron sputtering process.

The main difference between the EDX spectra is the presence of an Argon peak 28 in the spectrum 21 which is produced with a component coated with a standard PVD process. Whereas the coating using an arc PVD process does not show an argon peak (see spectrum 36). This argon content in the carbon coating deposited using standard PVD techniques is believed to lead to the decreased quality of the carbon coating and hence its inferior corrosion stability in comparison to carbon coatings 16 applied using arc-PVD.

FIGS. 10a & 10b show 2D spectra showing the sp2/sp3 ratios a) for a coated component coated using an unbalanced magnetron sputtering process and b) for a coated component coated using an arc-PVD process.

In this connection the range of ratios of sp2/sp3 for a coating applied with arc-PVD lie in the range of 35.6% to 45.8% sp2 and 64.4% to 54.2% sp3, whereas the coated component coated using unbalanced magnetron sputtering has a range of ratios of sp2/sp3 of 29% to 39% sp2 and 71% to 61% sp3.

The increase in approximately 5% of the number of sp3 bonds in the hydrogen free DLC layer 16, provided using arc-PVD, is believed to be part of the reason for the increase in quality of the carbon coating provided by arc-PVD in contrast to the coating applied using unbalanced magnetron sputtering.

It has furthermore been found that the use of Ti instead of Cr as a material of the adhesion layer 14 provides better stability under voltage peaks and blocks the diffusion of ions sufficiently. Ti is preferred due to the transpassivation potential of Ti being much higher than that of Cr.

The problem of weak adhesion of C onto Ti is solved by using arc-PVD for carbon (note Ti may still be sputtered or also applied using arc-PVD).

Moreover, the Ti+C (arc-PVD) coating is also outperforming Ti+C in high voltage performance. It is expected that these differences can be explained by several coating properties of arc-PVD (compared to sputter):

These are the density of the coating of approximately 2.1 to 2.3±0.1 g/cm$^3$, preferably 2.2±0.1 g/cm$^3$.

The reduced argon content in comparison to carbon coatings provided with standard sputtering techniques of as little as 0.1 at % argon (arc-PVD) compared to 2.2 at % argon (sputtered carbon) based on 100 at % of the hydrogen free DLC layer.

The increased kinetic energy of the carbon ions using arc-PVD may lead a diffusion of the Carbon into the Ti material and/or TiOx (if this is present) of the adhesion layer 14, i.e. the formation of a second gradient layer 20 between the adhesion layer 14 and the carbon coating 16 having a thickness in the range of 2 to 200 nm. Similarly a thickness of the first gradient layer 16 may also be selected in the range of 2 to 200 nm. Such a second gradient layer 20 leads to an improved adhesion between the carbon coating 16 and the adhesion layer 14.

Moreover, the sp2/sp3 ratio differs between arc-PVD coated components and PVD coated components, the different ratios provide better resistance to oxidation.

It should further be noted that arc-PVD is a much faster process than a standard PVD sputtering process and therefore leads to a reduced equipment complexity, equipment investment costs for the automotive industry, and a reduction of cost of ownership If the adhesion layer 14 is also provided using arc-PVD technology, then the etching step has to comprise an ion etching step rather than a plasma etching step. Moreover, such designs are simpler to manufacture as the coating apparatus can be simplified leading to lower cost and customer investment levels.

FIG. 11 shows a top view of an apparatus 50 for coating components 10 of a fuel cell stack comprising a plurality of vacuum chambers 60, 100, 102, 104, 108. Sidewalls 66 of the vacuum chamber 60 respectively comprise a plurality of arc and/or sputter cathodes 68, 68'. The plurality of arc and/or sputter cathodes 68, 68' are used to deposit the various layers and layer structures 14, 16, 18, 20 discussed in the foregoing.

One of the sidewalls 66' comprises a door 70 that is used to access the vacuum chamber 60 for initial loading of uncoated components 10 and of subsequent unloading of completed components 10.

The apparatus 50 comprises a plurality of fixtures 56 that extend within the chamber in parallel to an axis 58 of a vacuum chamber 60 housing the components 10 between a top side 62 and a bottom side 64 of the vacuum chamber 60 (see FIG. 6b).

The fixtures 56 each comprise one or more fixation members 74 per component 10. The one or fixation members 74 are configured such that they hold the components 10 at their respective back side 26, such that the active sides 24 thereof face outwardly towards the sidewalls 66, 66' of the deposition apparatus 50.

The use of fixtures 56 with fixation members 74 for coating the components 10 means that these can be coated in the apparatus 50 using the various PVD processes described herein.

After a coating process has been carried out the fixtures 56 are removed from the chamber 60 and either new fixtures 56 with a fresh batch of uncoated components 10 are introduced into the vacuum chamber 60, or the previous fixtures 56 with a fresh batch of uncoated items of the components 10 of the fuel cell stacks is reintroduced into the vacuum chamber 60 in order to coat the fresh batch of uncoated items of components 10 of the fuel cell stacks.

The fixtures 56 are moved linearly within the respective chamber 60. In the example of the drawing of FIG. 11, the components 10 are moved from the right to the left in the direction of the arrow, i.e. from vacuum chamber 100, to vacuum chamber 102, to vacuum chamber 104 and finally to vacuum chamber 108.

The components 10 are loaded into the deposition apparatus 50 at the first chamber 100. The first chamber 100 is then heated to a temperature in the range of 100 to 300° C. for heating the uncoated metal component 12 for the purposes of degassing while at the same time evacuating the chamber to a pressure selected in the range of $10^{-4}$ to $10^{-5}$ mbar.

Following the evacuation of the first chamber 100 and a degassing of the uncoated metal components 12 these are then moved into the second chamber 102 where they are etched using an etching source 76.

Following their etching the uncoated metal components are moved into third chamber 104 for coating with the adhesion layer 14. As indicated the third chamber 104 is also a vacuum chamber 60 that can be evacuated like the first and second chambers 100, 102 using a vacuum pump 106. The arc and/or sputter and/or Hipims sources 68, 68' of the PVD apparatus discussed herein are arranged at the sidewalls 66.

Following the deposition of the adhesion layer 14, the carbon coating 16 is provided on top of the adhesion layer 14. It should be noted in this connection that further coating chambers may also be provided for this purpose, they may e.g. be arranged between the vacuum chambers 104 and 108.

Following the coating process the fixtures 56 comprising the coated components 10 can be removed via the chamber 108. For this the vacuum chamber 60 of the last chamber 108 is brought to standard pressure. The individual chambers 100, 102, 104, 108 are separated from one another via load lock systems 110 that lock the respective chamber so that the desired atmosphere and pressure can be achieved within the respective chamber 100, 102, 104, 108.

The fixtures 56 indicated in FIG. 11 are arranged on a table (not shown) via which they are moved from vacuum chamber 100, 102, 104, 108 to the next. The fixtures 56 may be stationary relative to the table, i.e. they do not rotate relative to the table. Alternatively the fixtures 56 may be configured to rotate relative to the table so as to coat the components 10. If the fixtures 56 rotate then the sputter and/or arc cathodes 68, 68' may only need to be present at one wall 66, if the fixtures 56 do not rotate then it is necessary to arrange the sputter and/or arc cathodes 68, 68' at both sidewalls 66.

The cathodes 68, 68' used to form the DLC layer 16 can be pure graphite targets 68 that form DLC layer 16 without a dopant present therein.

In the following a method of coating the components 10 as discussed in the foregoing will be discussed. The method comprising the following steps, placing a plurality of uncoated metal components 12 on a frame and transporting the frame in the vacuum chamber 60, 100 and evacuating said vacuum chamber 60, 100 to the desired pressure. Optionally heating said uncoated metal components 12 to a predetermined temperature;

etching at least the active side 24 of said uncoated metal component 12 either in the same vacuum chamber 60, or in the second chamber 102;

coating said active sides 24 with the adhesion layer 14, the provision of the adhesion layer 12 may take place in the same vacuum chamber 102 as the etching took place or alternatively in the third chamber 104; and coating the adhesion layer 14 with the at least substantially hydrogen free DLC layer 16 by means of an arc-PVD process. The arc-PVD process may take place in the same vacuum chamber 60 as the coating with the adhesion layer took place or alternatively in a further chamber 104.

In this connection it should be noted both sides of the metal component, i.e. the bipolar plate, and/or the active and back sides 24, 26 of the half plates have to be coated during the arc-PVD coating process.

It should further be noted that if the coated metal component 10 is a half plate then this has the active side 24 and the back side 26.

If a gradient layer 18, 20 is provided then this is produced by varying the operating voltages and currents during the respective deposition step to ensure the build-up of the respective gradient layer 18, 20 in a manner known per se.

FIG. 12 shows AFM images of a surface of a carbon coated component coated using a sputtered carbon process at two different scanning locations. FIG. 13 also shows AFM images of a surface of a carbon coated component at two different scanning locations, in this instance the carbon coating is applied using an arc-PVD process.

The AFM images recorded in both FIGS. 12 and 13 were recorded using a Bruker FastScan AFM, fitted with a Si probe (Fastscan-A) with a tip of 5 nm radius in a scan tapping mode at 1 Hz scan rate per line. Using the AFM probe the surface roughness (Sa), i.e. the arithmetic mean height of the surface, and increased surface area (Sdr) of the respective samples were measured at two different and separate locations, i.e. the developed interfacial area ratio. This parameter is expressed as the percentage of the definition area's additional surface area contributed by the texture as compared to a planar definition area.

As a comparison of the two FIGS. 12 and 13 shows, a carbon coating applied using sputtering has an increased surface roughness and an increased surface area in contrast to the carbon coating 16 applied using arc-PVD. This increase in the surface area is possibly the reason why the sputtered carbon coating is more sensitive to corrosion than the smoother carbon coating 16 applied using arc-PVD, since the surface area of the respective component is larger.

In this connection it should be noted that the surface roughness of the arc-PVD carbon coating is preferably selected in the range of 0.9 to 1.5 nm Sa (i.e. arithmetic mean height) for a scanning area of 1 $\mu m^2$, especially of 1 to 1.3 nm for a scanning area of 1 $\mu m^2$ Sa and in the AFM image of FIG. 13 is 1.1 nm Sa for a scanning area of 1 $\mu m^2$. In contrast to this the surface roughness of the sputtered carbon coating of FIG. 12 is 2.9 nm Sa for a scanning area of 1 $\mu m^2$.

In this connection it should further be noted that the surface area Sdr of the arc-PVD carbon coating 16 is preferably selected in the range of 2 to 4% Sdr for a scanning area of 1 $\mu m^2$, especially 2.5 to 3.1% Sdr for a scanning area of 1 $\mu m^2$, and in the AFM image of FIG. 13 is 2.7% Sdr for a scanning area of 1 $\mu m^2$. In contrast to this the surface are of the sputtered carbon coating of FIG. 12 is 10.6% Sdr and 11.4% Sdr respectively for a scanning area of 1 $\mu m^2$.

Figure 14:
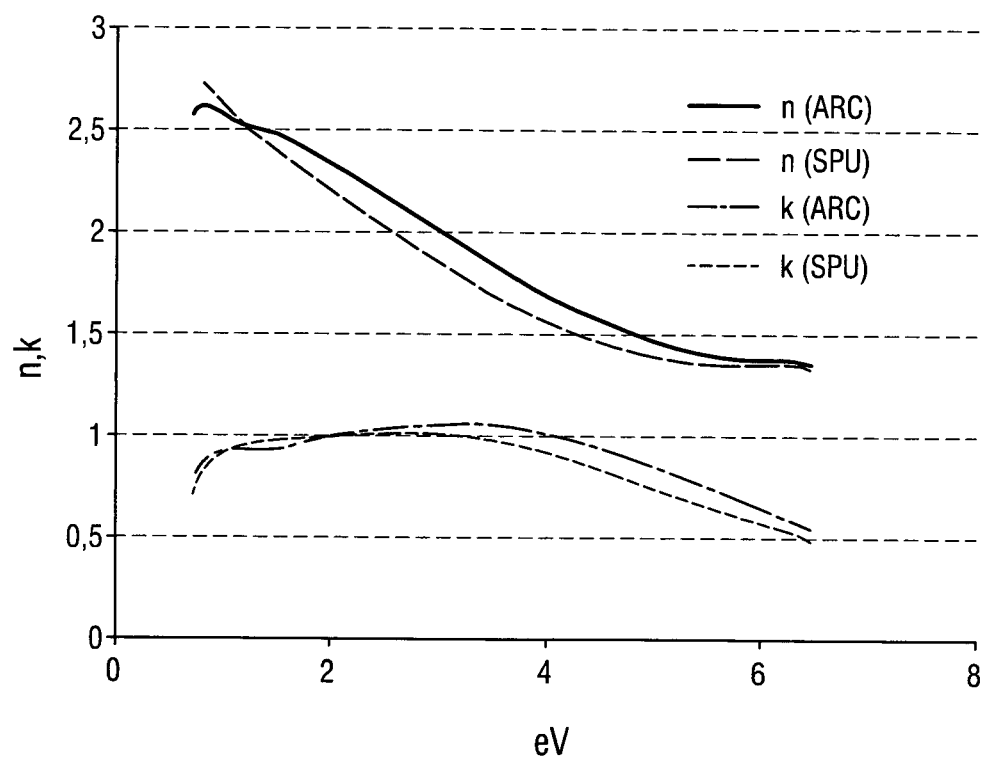

FIG. 14 shows results of ellipsometry measurements showing the refractive index n and absorption factor k versus energy/wavelength for samples coated with an arc-PVD process and samples coated using a sputtered carbon process. The ellipsometry measurements were conducted with a Woollam M2000DI Spectroscopic Ellipsometer. The wavelength interval was selected to be 192 to 1689 nm. The measurements were performed at 7 angles of incident from 50 to 80 degrees (in steps of 5 degrees) with respect to the surface normal. In order to conduct the ellipsometry measurements, layer thicknesses of the actual carbon coatings 16 have to initially be determined. Typical layer thicknesses are in the range of 5 to 500 nm for such carbon coatings 16. By way of example, transmission electron microscopy (TEM) can be conducted to determine the layer thicknesses. The layer thicknesses determined with the TEM are then input into the software model used for the ellipsometry measurements.

The measurements were conducted to determine the refractive index n and the absorption k versus energy/wavelength of the samples coated with carbon. In this connection it has been found that the carbon coating 16 applied using the arc-PVD process has a refractive index n in the range of 2.25 to 2.4 for an energy of 2 eV in ellipsometry measurements; and/or a refractive index n in the range of 1.6 to 1.8 for an energy of 4 eV in ellipsometry measurements and/or an absorption value k of 0.95 to 1.1 for an energy of 4 eV in the ellipsometry measurements.

As indicated in FIG. 14 the refractive index n for the arc-coated carbon coating 16 at 4 eV is 1.71 and for an energy of 2 eV is 2.33 in ellipsometry measurements. In comparison to this, the sputtered carbon coating has a refractive index n at 4 eV of 1.58 and for an energy of 2 eV has a refractive index n of 2.16.

This shows that the arc-PVD carbon coating 16 has a higher density than the sputtered carbon coating due to the increased number of the refractive index n.

The carbon coating 16 applied using arc-PVD has an absorption value k of 1.05 for an energy of 4 eV whereas the sputtered carbon coating has an absorption value k of 0.9 for the ellipsometry measurements. The higher k-value of the arc PVD coatings also indicates an improved electrical conductivity in comparison to the sputtered carbon coatings.

| List of reference numerals: | |
|---|---|
| 10, 10' | component of a fuel cell, bipolar plate |
| 12 | metal component |
| 14 | adhesion layer |
| 16 | carbon coating |
| 18 | first gradient layer |
| 20 | second gradient layer |
| 22 | top layer |
| 24 | active side |
| 26 | back side |
| 28 | argon peak |
| 50 | deposition apparatus |
| 56 | fixture |
| 60 | vacuum chamber |
| 62 | top side of 60 |
| 64 | bottom side of 60 |
| 66, 66' | sidewall, sidewall with 70 |
| 68, 68' | arc and/or sputter cathode, arc and/or sputter cathode |
| 70 | door |
| 72 | motor |
| 74 | fixation members |
| 76 | plasma source |
| 100 | chamber |
| 102 | chamber |
| 104 | chamber |
| 106 | vacuum pump |
| 108 | chamber |
| 110 | load lock system |

The invention claimed is:

1. A method of coating one or more components of a fuel cell stack, the method comprising the steps of:
   providing an uncoated metal component;
   etching said uncoated metal component;
   optionally depositing an adhesion layer on the etched uncoated metal component by means of one of a physical vapor deposition process, an arc physical vapor deposition process, an arc ion plating process, a sputtering process, and a Hipims process; and
   depositing a carbon coating on the adhesion layer if provided or directly on said etched uncoated metal component,
   wherein the carbon coating is deposited with a layer thickness selected in the range of 5 to 500 nm at a bias voltage of −0 to −200V
   wherein the carbon coating comprises an at least substantially hydrogen free DLC layer, deposited by one of an arc physical vapor deposition process, an arc ion plated process, and a Hipims process, wherein the adhesion layer comprises a layer of one or more materials comprising the adhesion layer and one or more gradient layers comprising:
   a first gradient layer of metal mixed with said one or more materials of the adhesion layer with the amount of metal decreasing over a height of the first gradient layer and an amount of the one or more materials of the adhesion layer increasing over the height of the first gradient layer, up to the layer comprising said one or more one or more materials of the adhesion layer.

2. The method in accordance with claim 1, wherein the step of etching is one of a plasma etching process or metal ion etching process carried out for a period ranging between 1 and 60 minutes with a bias voltage of between 0 to −1200 V.

3. The method in accordance with claim 1, wherein the step of depositing an adhesion layer comprises depositing a layer having a thickness in the range of 25 to 500 nm at a bias voltage selected in the range of −0 to −350V.

4. The method in accordance with claim 1, further comprising the adhesion layer, and wherein the adhesion layer comprises at least one of Ti, Cr, Ta, Nb, Zr, TIN, CrN, NbN, ZrN and combinations thereof.

5. The method in accordance with claim 1, further comprising the adhesion layer, and wherein the adhesion layer comprises a layer of one or more materials comprising the adhesion layer and one or more gradient layers comprising:
   a second gradient layer comprising the one or more materials of the adhesion layer mixed with the carbon of the carbon coating, with the amount of the one or more materials of the adhesion layer decreasing over a height of the second gradient layer and an amount of carbon increasing over the height of the second gradient layer up to the carbon coating.

6. The method in accordance with claim 1, wherein the at least substantially hydrogen free DLC layer comprises either a top layer having a dopant present therein, or includes a dopant throughout the at least substantially hydrogen free DLC layer.

7. A method of coating one or more components of a fuel cell stack, the method comprising the steps of:
   providing an uncoated metal component;
   etching said uncoated metal component;
   optionally depositing an adhesion layer on the etched uncoated metal component by means of one of a physical vapor deposition process, an arc physical vapor deposition process, an arc ion plating process, a sputtering process, and a Hipims process; and
   depositing a carbon coating on the adhesion layer if provided or directly on said etched uncoated metal component,
   wherein the carbon coating is deposited with a layer thickness selected in the range of 5 to 500 nm at a bias voltage of −0 to −200V
   wherein the carbon coating comprises an at least substantially hydrogen free DLC layer, deposited by one of an arc physical vapor deposition process, an arc ion plated process, and a Hipims process,
   wherein the at least substantially hydrogen free DLC layer comprises either a top layer having a dopant present therein, or includes a dopant throughout the at least substantially hydrogen free DLC layer,
   wherein the dopant is selected from the group of members consisting of titanium, zirconium, hafnium, vanadium, niobium, tantalum, chromium, molybdenum, tungsten, nitrogen, silicon and combinations of the foregoing.

8. A method of coating one or more components of a fuel cell stack, the method comprising the steps of:
   providing an uncoated metal component;
   etching said uncoated metal component;
   optionally depositing an adhesion layer on the etched uncoated metal component by means of one of a physical vapor deposition process, an arc physical vapor deposition process, an arc ion plating process, a sputtering process, and a Hipims process; and depositing a carbon coating on the adhesion layer if provided or directly on said etched uncoated metal component, wherein the carbon coating is deposited with a layer thickness selected in the range of 5 to 500 nm at a bias voltage of −0 to −200V wherein the carbon coating comprises an at least substantially hydrogen free DLC layer, deposited by one of an arc physical vapor deposition process, an arc ion plated process, and a Hipims process, wherein the at least substantially hydrogen free DLC layer comprises either a top layer having a dopant present therein, or includes a dopant throughout the at least substantially hydrogen free DLC layer, wherein a percentage of the dopant is 0.2 to 10 at % based on 100 at % of the at least substantially hydrogen free DLC layer respectively of the top layer comprising the dopant.

9. The method in accordance with claim 1,
wherein said method is conducted in a vacuum chamber and a temperature of said vacuum chamber is regulated to a temperature in the range of 120 to 400° C. during said step of coating said component with the carbon coating.

10. A component of a fuel cell optionally obtainable using a method in accordance with claim 1, the fuel cell component comprising:
a metal component,
an adhesion layer optionally formed on said metal component, and
a carbon coating formed on said adhesion layer if provided or on said metal component, said carbon coating comprising an at least substantially hydrogen free DLC layer having a hardness selected in the range of 20 to 70 GPa and an Argon content of less than 1 at % Argon based on 100 at % of the at least substantially hydrogen free DLC layer.

11. The component in accordance with claim 10,
wherein the at least substantially hydrogen free DLC layer has a hardness selected in the range of 30 to 50 GPa.

12. The component in accordance with claim 10,
wherein the at least substantially hydrogen free DLC layer comprises one or more ta-C layers and/or one or more a-C layers.

13. The component in accordance with claim 10,
wherein a proportion of the sp2 to sp3 content of the at least substantially hydrogen free DLC layer lies in the range of 30 to 80% sp2 to 70 to 20% sp3.

14. The component in accordance with claim 10,
wherein said at least substantially hydrogen free DLC layer is a DLC layer containing less than 1 at % hydrogen based on 100 at % of the at least substantially hydrogen free DLC layer.

15. The component in accordance with claim 10,
wherein the at least substantially hydrogen free DLC layer comprises either a top layer having a dopant present therein, or includes a dopant throughout the at least substantially hydrogen free DLC layer.

16. The component in accordance with claim 15,
wherein the dopant is selected from the group of members consisting of titanium, zirconium, hafnium, vanadium, niobium, chromium, molybdenum, tungsten, nitrogen, silicon and combinations of the foregoing.

17. The component in accordance with claim 15,
wherein a percentage of the dopant is 0.2 to 10 at % based on 100 at % of the at least substantially hydrogen free DLC layer respectively of the top layer comprising the dopant.

18. The component in accordance with claim 10,
further comprising the adhesion layer, wherein the adhesion layer comprises at least one material selected from the group of members consisting of titanium, zirconium, hafnium, vanadium, niobium, tantalum, chromium, molybdenum, tungsten, nitrogen, silicon and combinations of the foregoing.

19. The component in accordance with claim 10,
further comprising the adhesion layer, wherein the adhesion layer has a layer thickness of 25 to 500 nm.

20. The component in accordance with claim 10,
further comprising the adhesion layer, wherein the adhesion layer comprises one or more gradient layers that are formed either directly beneath the at least substantially hydrogen free DLC layer, and/or directly on top of the metal component.

21. The component in accordance with claim 20,
wherein the one or more gradient layers comprise a mixture of the materials of at least some of the components of the layers formed either side of the one or more gradient layers.

22. The component in accordance with claim 20,
wherein a layer thickness of said one or more gradient layers is selected in the range of 2 to 200 nm.

23. The component in accordance with claim 20,
wherein the gradient layer is formed directly on top of the adhesion layer and the material of the layer arranged directly beneath the gradient layer is the material of the adhesion layer and the layer on top of the gradient layer is the at least substantially hydrogen free DLC layer and/or the gradient layer is formed directly on top of the metal component and the material of the layer arranged directly beneath the gradient layer is the material of the metal component and the material of the layer arranged directly on top of the gradient layer is the material of the adhesion layer.

24. The component in accordance claim 10,
wherein the carbon coating has a refractive index n in the range of 2.25 to 2.4 for an energy of 2 eV in ellipsometry measurements.

25. The component in accordance with claim 10,
wherein the carbon coating has a refractive index n in the range of 1.6 to 1.8 for an energy of 4 eV in ellipsometry measurements.

26. The component in accordance with claim 10,
wherein the carbon coating has an absorption value k of 0.95 to 1.1 for an energy of 4 eV in ellipsometry measurements.

27. The component in accordance with claim 10,
wherein the carbon coating has a surface roughness selected in the range of 0.9 to 1.5 nm for a scanning area of 1 μm$^2$.

28. The component in accordance with claim 10,
wherein the carbon coating has a surface area selected in the range of 2 to 4% Sdr for a scanning area of 1 μm$^2$.

29. An apparatus for coating one or more components of a fuel cell stack, said apparatus being configured to carry out a method of coating said one or more components of a fuel cell stack, the method comprising the steps of:
providing an uncoated metal component;
etching said uncoated metal component;

optionally depositing an adhesion layer on the etched uncoated metal component by means of one of a physical vapor deposition process, an arc physical vapor deposition process, an arc ion plating process, a sputtering process, and a Hipims process; and depositing a carbon coating on the adhesion layer if provided or directly on said etched uncoated metal component, wherein the carbon coating is deposited with a layer thickness selected in the range of 5 to 500 nm at a bias voltage of −0 to −200V and wherein the carbon coating comprises an at least substantially hydrogen free DLC layer, deposited by one of an arc physical vapor deposition process, an arc ion plated process, and a Hipims process, the apparatus being an inline coating system, comprising:

a plurality of vacuum chambers arranged in a series one after another one or more cathodes arranged in at least some of the plurality of vacuum chambers; and one or more fixtures respectively configured to receive a plurality of the uncoated metal components, with the sides to be coated facing the one or more cathodes, the cathodes being a cathode for at least one of a physical vapor deposition process, an arc physical vapor deposition process, an arc ion plating process, a sputtering process, and a Hipims process;

wherein said one or more fixtures are arranged to be moved linearly within the respective vacuum chamber and from vacuum chamber to vacuum chamber, wherein each vacuum chamber is configured to carry out a process, with the processes being selected from the group of members comprising: heating, evacuating, etching, depositing one or more adhesion layers, coating, removing and/or combinations of the foregoing.

30. A method of coating one or more components of a fuel cell stack, the method comprising the steps of:

providing an uncoated metal component;

etching said uncoated metal component;

optionally depositing an adhesion layer on the etched uncoated metal component by means of one of a physical vapor deposition process, an arc physical vapor deposition process, an arc ion plating process, a sputtering process, and a Hipims process; and depositing a carbon coating on the adhesion layer if provided or directly on said etched uncoated metal component, wherein the carbon coating is deposited with a layer thickness selected in the range of 5 to 500 nm at a bias voltage of −0 to −200V wherein the carbon coating comprises an at least substantially hydrogen free DLC layer, deposited by one of an arc physical vapor deposition process, an arc ion plated process, and a Hipims process, wherein said method is conducted in a vacuum chamber and a temperature of said vacuum chamber is regulated to a temperature in the range of 160 to 250° C. during said step of coating said component with the carbon coating.

* * * * *